United States Patent
Alnarraie et al.

(10) Patent No.: US 11,688,962 B2
(45) Date of Patent: Jun. 27, 2023

(54) SCALABLE ELECTRONIC MODULES HAVING A COMMON FORM FACTOR

(71) Applicant: Veoneer US LLC, Southfield, MI (US)

(72) Inventors: Bashar Alnarraie, Sterling Heights, MI (US); Frank Judge, South Lyon, MI (US)

(73) Assignee: VEONEER US, LLC, Southfield, MI (US)

( * ) Notice: Subject to any disclaimer, the term of this patent is extended or adjusted under 35 U.S.C. 154(b) by 93 days.

(21) Appl. No.: 17/319,826

(22) Filed: May 13, 2021

(65) Prior Publication Data

US 2022/0368050 A1 Nov. 17, 2022

(51) Int. Cl.
| | |
|---|---|
| *H01R 12/70* | (2011.01) |
| *H01R 12/73* | (2011.01) |
| *G01S 13/931* | (2020.01) |
| *H01R 12/75* | (2011.01) |
| *H01R 12/72* | (2011.01) |

(52) U.S. Cl.
CPC .......... *H01R 12/732* (2013.01); *G01S 13/931* (2013.01); *H01R 12/7088* (2013.01); *H01R 12/727* (2013.01); *H01R 12/75* (2013.01); *H01R 2201/26* (2013.01)

(58) Field of Classification Search
CPC ......... H01R 12/732; H01R 12/7088; H01R 12/727; H01R 12/75; H01R 2201/26; H01R 12/72; H01R 12/71; H01R 12/70; G01S 13/931
USPC .......................................................... 439/65
See application file for complete search history.

(56) References Cited

U.S. PATENT DOCUMENTS

| | | | | |
|---|---|---|---|---|
| 4,703,394 A | * | 10/1987 | Petit .................... | H01R 12/737 361/803 |
| 4,929,185 A | * | 5/1990 | Wong .................... | H01R 12/52 439/97 |
| 5,013,249 A | * | 5/1991 | Lindeman .......... | H01R 13/2407 439/74 |
| 5,594,621 A | * | 1/1997 | van Rumpt ............. | G06F 1/185 439/631 |
| 5,677,830 A | * | 10/1997 | Nogas .................. | H05K 7/1435 361/732 |

(Continued)

OTHER PUBLICATIONS

NetCarShow.com: "Ford>>2021 F-150." Accessed May 13, 2021. https://www.netcarshow.com/ford/2021-f-150/1600x1200/wallpaper_1a.htm.

(Continued)

*Primary Examiner* — Harshad C Patel

(57) ABSTRACT

An electronic system for a vehicle includes: a first module including: a first circuit board having a predetermined form factor; a first module on the first circuit board and including a plurality of pins; a first electrical connector disposed on a first surface of the first circuit board and including a plurality of pins; and a plurality of electrical conductors connecting the pins of the first electrical connector with the pins of the first module, respectively; and a second module including: a second circuit board having the predetermined form factor; a second module on the second circuit board and including a plurality of pins; a second electrical connector disposed on a first surface of the second circuit board and including a plurality of pins, the second electrical connector coupled to the first electrical connector.

19 Claims, 9 Drawing Sheets

(56) References Cited

U.S. PATENT DOCUMENTS

| | | | | |
|---|---|---|---|---|
| 5,926,378 | A * | 7/1999 | DeWitt | H05K 1/14 710/301 |
| 5,956,835 | A * | 9/1999 | Aksu | G01R 1/07328 29/559 |
| 6,091,604 | A * | 7/2000 | Plougsgaard | H05K 7/1432 174/16.3 |
| 6,431,879 | B2 * | 8/2002 | Brekosky | H01R 12/7047 411/389 |
| 6,690,582 | B2 * | 2/2004 | Sumida | H01R 9/226 361/752 |
| 6,698,851 | B1 * | 3/2004 | Ludl | H05K 5/0021 312/111 |
| 6,711,811 | B2 * | 3/2004 | Hensley | H05K 7/1061 361/677 |
| 6,731,514 | B2 * | 5/2004 | Evans | H05K 1/144 361/792 |
| 7,733,650 | B2 * | 6/2010 | Okayama | H01L 25/162 165/185 |
| 8,446,733 | B2 * | 5/2013 | Hampo | H01R 12/71 361/775 |
| 8,446,773 | B2 * | 5/2013 | Lee | G11C 11/5642 365/185.09 |
| 9,325,086 | B2 * | 4/2016 | Brodsky | H01R 12/716 |
| 9,843,135 | B2 * | 12/2017 | Guetig | H01R 13/665 |
| 10,187,989 | B2 * | 1/2019 | Dunkel | H05K 1/144 |
| 10,681,812 | B2 * | 6/2020 | Hartman | H05K 1/0278 |
| 10,852,784 | B2 * | 12/2020 | Schnell | G06T 1/20 |
| 2001/0031568 | A1 * | 10/2001 | Brekosky | H01R 12/7082 439/74 |
| 2008/0101049 | A1 * | 5/2008 | Casto | H05K 1/14 361/788 |
| 2015/0146400 | A1 * | 5/2015 | Huffman | H05K 1/144 403/299 |
| 2020/0055480 | A1 * | 2/2020 | Herbert | G06T 7/80 |

OTHER PUBLICATIONS

"Quickly Tell ECU trouble, ECU alternative method Notes!" Auto Knowledge, Auto Repaid. Auto Repair Technician Home. Jun. 29, 2017. https://www.car-auto-repair.com/quickly-tell-ecu-trouble-ecu-alternative-method-notes/.

Elektrosunda: "Board Stacking" Elektrodunda: belajar elektronika, pemprograman, dan teknologi; Feb. 21, 2011. https://elektrosunda.wordpress.com/2011/02/21/board-stacking/.

Scot Strong "Micron Announces Xtrmflash Nore Memory for instant-on application"; SSD Optimization Guide: The SSDReview. Accessed May 13, 2021. https://www.thessdreview.com/daily-news/latest-buzz/micron-announces-xtrmflash-nor-memory-for-instant-on-applications/.

"Explosion of Electronic Systems," accessed May 13, 2021. https://www.embitel.com/wp-content/uploads/Image-2.png.

* cited by examiner

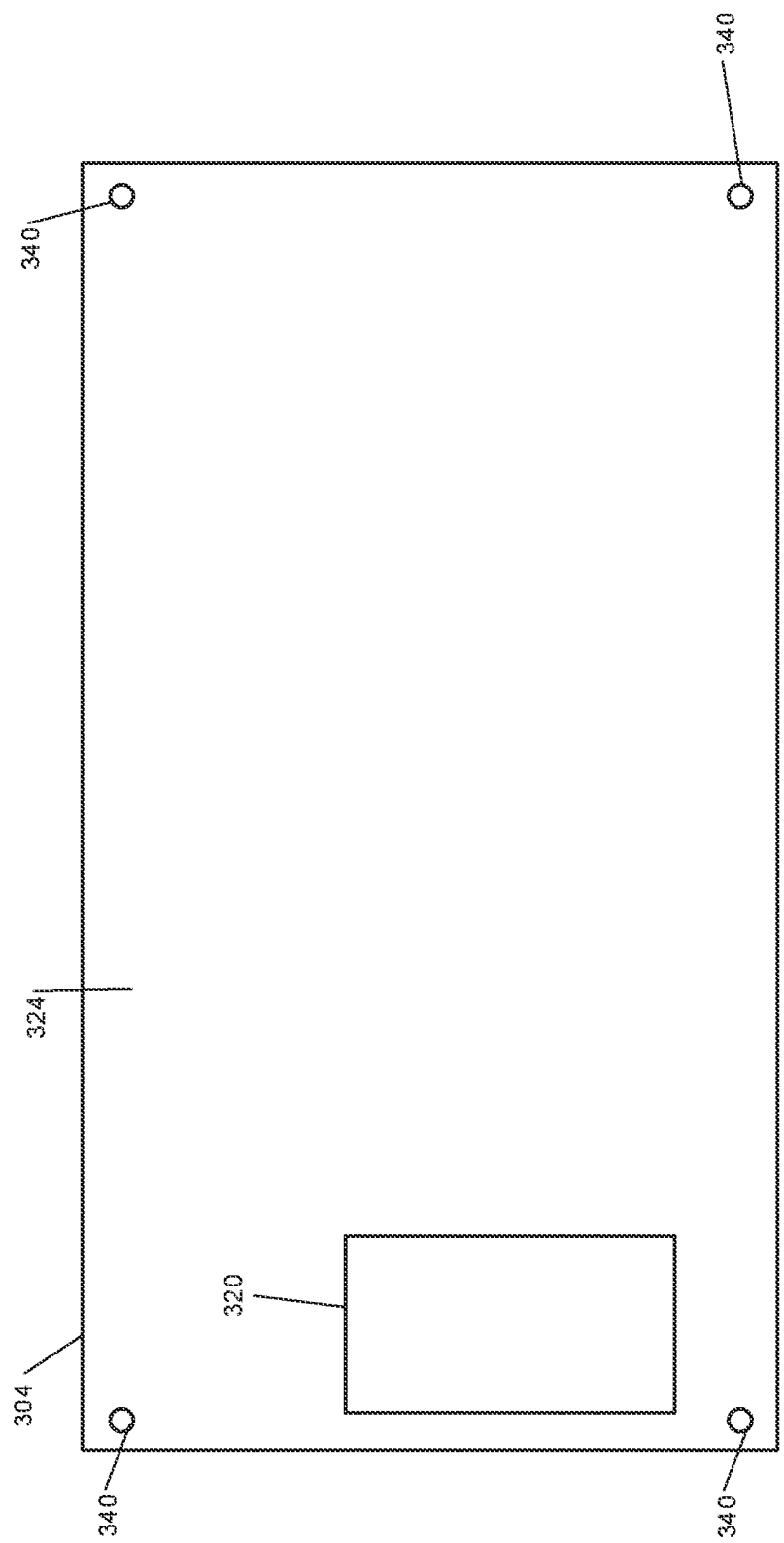

SCALABLE ELECTRONIC MODULES HAVING A COMMON FORM FACTOR

FIELD

The present disclosure relates to electronic modules and more particularly to electronic control modules that are scalable and have the same form factor.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Vehicles may include a plurality of electronic control modules (ECMs) for specific vehicle functions. For example, a vehicle may include an ECM configured to provide automated highway driving, an ECM configured to provide cruise control, an ECM configured to provide collision avoidance, etc. A vehicle may have more than 80 different ECMs for different vehicle functions. ECMs may also be referred to as electronic control units (ECUs).

Each ECM, however, typically has a different form factor and is specific to its functionality. The ECMs also do not allow for the addition or subtraction of one or more inputs (e.g., sensors or cameras) without extensive hardware and/or software changes.

SUMMARY

In a feature, an electronic system for a vehicle includes: a first module including: a first circuit board having a predetermined form factor; a first module on the first circuit board and including a plurality of pins; a first electrical connector disposed on a first surface of the first circuit board and including a plurality of pins; and a plurality of electrical conductors connecting the pins of the first electrical connector with the pins of the first module, respectively; and a second module including: a second circuit board having the predetermined form factor; a second module on the second circuit board and including a plurality of pins; a second electrical connector disposed on a first surface of the second circuit board and including a plurality of pins, the second electrical connector coupled to the first electrical connector such that the pins of the first electrical connector are electrically connected to the plurality of pins of the second electrical connector, respectively; a third electrical connector disposed on a second surface of the second circuit board that is opposite the first surface of the second circuit board, the third electrical connector including a plurality of pins that are electrically connected to the plurality of pins of the second electrical connector, respectively; and a plurality of electrical conductors connecting ones of the pins of the second module with one of: (a) ones of the pins of the second electrical connector, respectively; and (b) ones of the pins of the third electrical connector, respectively.

In further features, the second module is further connected to at least one of: (a) a sensor configured to sense at least one parameter within a passenger cabin of the vehicle; and (b) a camera configured to capture images within the passenger cabin of the vehicle.

In further features, the second module is configured to perform an advanced driver assistance function based on input from the at least one of (a) the sensor and (b) the camera.

In further features, the second module is connected to the sensor, and the sensor is one of a radar sensor and an infrared (IR) sensor.

In further features, a third module includes: a third circuit board having the predetermined form factor; a third module on the third circuit board and including a plurality of pins; a fourth electrical connector disposed on a first surface of the third circuit board and including a plurality of pins, the third electrical connector coupled to the third electrical connector such that the pins of the third electrical connector are electrically connected to the plurality of pins of the fourth electrical connector, respectively; a fifth electrical connector disposed on a second surface of the third circuit board that is opposite the first surface of the third circuit board, the fifth electrical connector including a plurality of pins that are electrically connected to the plurality of pins of the fourth electrical connector, respectively; and a plurality of electrical conductors connecting second ones of the pins of the third module with second one of: (a) second ones of the pins of the fourth electrical connector, respectively; and (b) second ones of the pins of the fifth electrical connector, respectively.

In further features, the third module is further connected to at least one of: (a) a sensor configured to sense at least one parameter within a passenger cabin of the vehicle; and (b) a camera configured to capture images within the passenger cabin of the vehicle.

In further features: the first module includes apertures through the first circuit board at predetermined placement areas; and the second module includes apertures through the second circuit board at the predetermined placement areas.

In further features, standoffs are disposed at the apertures of the first module and the apertures of the second module and configured to separate the first and second modules.

In further features, the first surface of the first circuit board faces the first surface of the second circuit board.

In further features: the first electrical connector is disposed in a placement area on the first surface of the first circuit board; and the third electrical connector is disposed on the placement area on the second surface of the second circuit board.

In further features, the first and second modules are disposed behind trim of a passenger cabin of the vehicle.

In further features, the first and second circuit boards are printed circuit boards.

In further features, the first module is configured to: receive an input voltage; convert the input voltage to a plurality of different voltages; and output the different voltages via ones of the electrical conductors, respectively.

In further features, the different voltages are less than the input voltage.

In further features, the input voltage is a voltage of a battery of the vehicle.

In further features, the first module is configured to communicate via an Ethernet communication protocol via ones of the electrical conductors.

In further features, the first module is configured to communicate using universal asynchronous receiver-transmitter (UART) communication via ones of the electrical conductors.

In further features, the first module is configured to communicate using serial peripheral interface (SPI) communication via ones of the electrical conductors.

In further features, the first module is configured to communicate using inter-integrated circuit (I2C) communication via ones of the electrical conductors.

In further features: at least one of the pins of the first module is configured for analog input and output; and at least one of the pins of the first module is configured for digital input and output.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 3A-3B include top and bottom views of an example second module for an ADAS;

In the drawings, reference numbers may be reused to identify similar and/or identical elements.

DETAILED DESCRIPTION

Electronic control modules (ECMs) of vehicles may be designed to meet specific use cases and perform specific vehicle functions. The footprint (or form factor) and the design of each ECM, however, is not scalable to add one or more additional inputs (e.g., sensors and/or cameras). Connector pinout may also not be scalable to allow for the addition of one or more sensors.

ECM variation may drive ECM design differences, which drives higher development and validation costs and increases manufacturing complexity. This may be true even from customer to customer for the same ECM functionality.

The present application involves ECMs with a standard form factor to be repeatable, scalable, and easily installable, such as behind vehicle trim. Sensors and/or cameras can also be added without the need to change the form factor of the ECM. For example, one or more sensors can be electrically connected onto an ECM via an on ECM connector.

Power and communication can be distributed across multiple connected ECMs. This decreases development and validation costs, decreases manufacturing complexity, and enables ECM changes to be made without entire ECM redesigns, which reduces cost.

Figure 1:
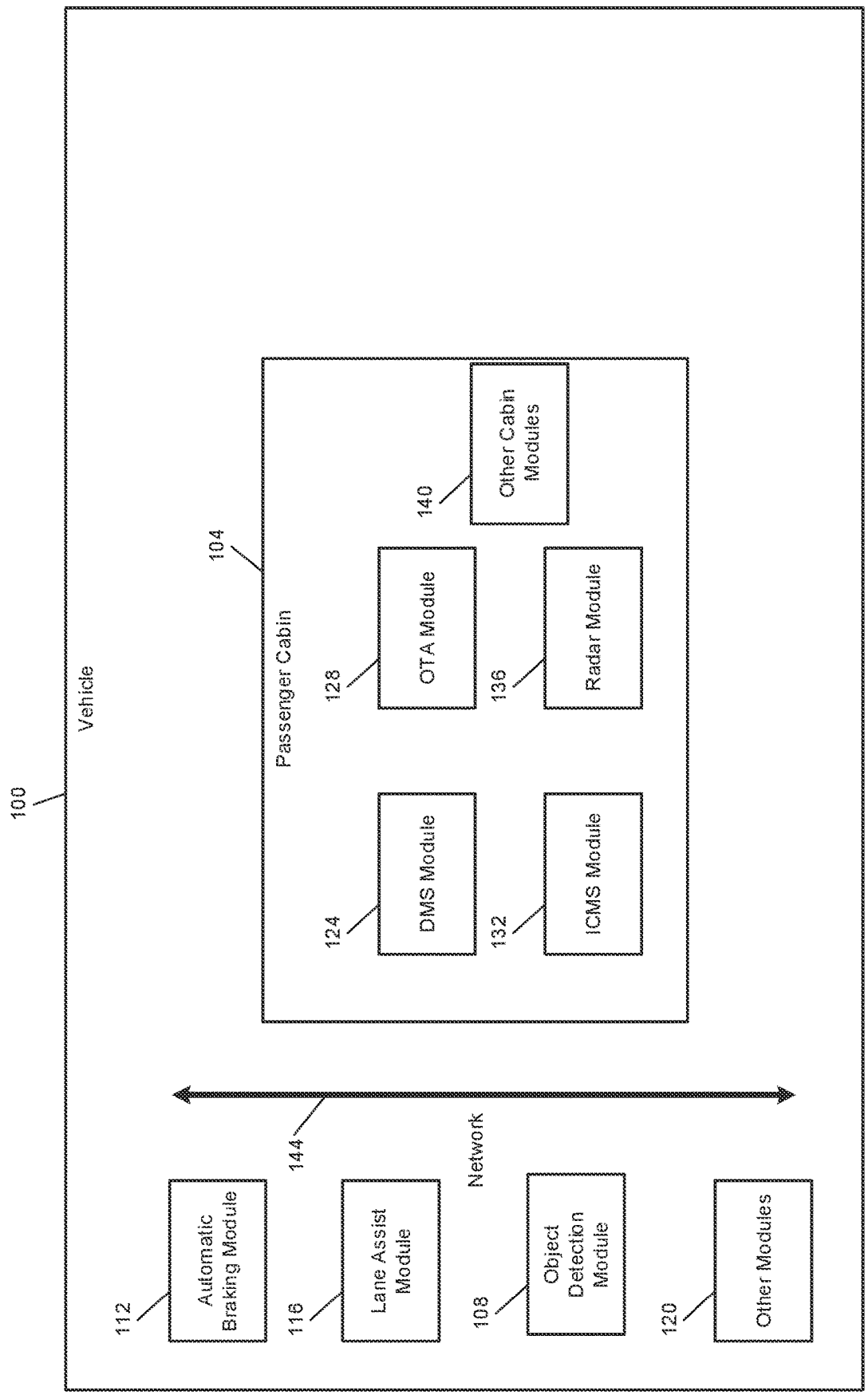
FIG. 1 is a functional block diagram of an example system of a vehicle.

FIG. 1 is a functional block diagram of an example system of a vehicle 100. The vehicle includes a passenger cabin 104. The vehicle 100 also includes one or more propulsion devices, such as one or more electric motors and/or an engine. The vehicle 100 may include a transmission and/or other types of gearing devices configured to transfer torque to one or more wheels of the vehicle 100 from the engine and/or the electric motor(s).

One or more seats are included within the passenger cabin 104. Users of the vehicle 100 may sit on the seat(s). A driver may actuate an accelerator pedal to control acceleration of the vehicle 100. The driver may actuate a brake pedal to control application brakes of the vehicle 100. The driver may actuate a steering wheel to control steering of the vehicle 100.

The vehicle 100 may include one or more advanced driver assistance (ADAS) systems implemented on one or more modules, respectively. For example, an object detection module 108 may detect objects (e.g., vehicles, pedestrians, etc.) and locations of the objects located around the vehicle based on input from one or more sensors and/or cameras. As another example, an automatic braking module 112 may automatically perform braking (without driver actuating the brake pedal), such as to avoid colliding with an identified object. As another example, a lane assist module 116 may adjust steering (without the driver actuating the steering wheel) to maintain the vehicle within a lane. The vehicle may also include one or more other modules 120 for one or more other ADAS configured to utilize one or more sensed parameters from outside of the vehicle 100.

As another example, the vehicle 100 may include a driver monitoring system (DMS) module 124 that monitors gaze and/or one or more other characteristics of the driver within the passenger cabin 104 using input from one or more sensors and/or cameras within the passenger cabin 104. As another example, the vehicle 100 may include an over the air (OTA) module 128 configured to provide over the air (wireless) updates of code of the vehicle. As another example, the vehicle 100 may include an interior cabin monitoring system (ICMS) module 132 configured to monitor one or more conditions within the passenger cabin 104 using input from one or more sensors and/or cameras within the passenger cabin 104. As another example, the vehicle 100 may include a radar module 136 configured to monitor one or more conditions within the passenger cabin 104 using input from one or more radar sensors within the passenger cabin 104. The vehicle may also include one or more other cabin modules 140 for one or more other ADAS configured to utilize one or more sensed parameters from within the passenger cabin 104.

While examples of ADAS systems are provided herein, the present application is also applicable to other ADAS. Examples of other modules for other ADAS include, but are not limited to, a restraints module that controls restraints (e.g., seat belts, air bags, etc.) within the passenger cabin 104, a night vision module for night vision outside of the vehicle, etc.

Modules of the vehicle 100 may communicate via one or more communication networks or busses, such as network 144. Examples of communication networks/busses include a controller (or car) area network (CAN) bus, a local interconnect network (LIN) bus, and other types of communication networks/busses.

The modules of the vehicle 100 discussed herein, such as the modules of the ADAS, have a common form factor including the same length and width. The modules also include connectors such that two or more modules can be stacked and connected together to minimize space of the combined two or more modules. This allows the combined modules to minimize space, such as behind trim of the passenger cabin 104.

Figure 2:
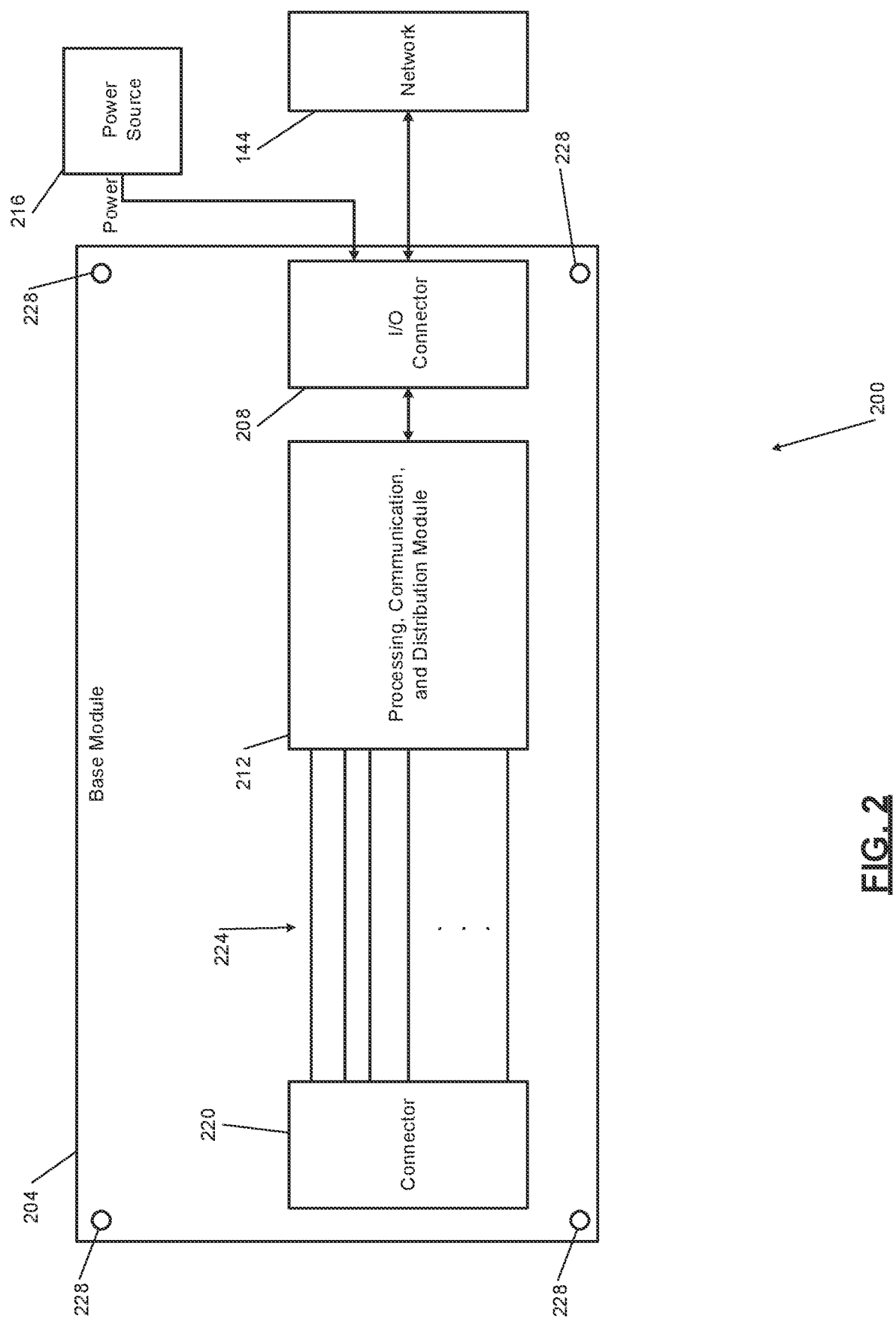
FIG. 2 includes a top view of an example base module for one or more ADAS.

FIG. 2 includes a top view of an example base module 200 for one or more ADAS, such as monitoring one or more characteristics within the passenger cabin 104. The base module 200 includes a circuit board 204, such as a printed circuit board (PCB). The circuit board 204 has a form factor. The form factor includes a predetermined length, a predetermined width, and a predetermined thickness of the circuit board 204.

The base module 200 may include an input/output (I/O) connector 208 disposed on a surface of the circuit board 204. A processing, communication, and distribution module 212 may also be disposed on the surface of the circuit board 204.

The processing, communication, and distribution module 212 may receive power (e.g., 12 volt direct current (DC) power) from a power source (e.g., a battery of the vehicle 100) 216 via the I/O connector 208. The processing, communication, and distribution module 212 may also transmit and receive data to and from the network 144 via the I/O connector 208. The processing, communication, and distribution module 212 may include, for example a field programmable gate array (FPGA), a system on chip (SOC), or an integrated circuit (IC).

The base module 200 also includes a connector 220 disposed on the surface of the circuit board 204. The connector 220 enables one or more other modules to be electrically connected to and stacked upon the base module 200, as discussed further below (e.g., see FIG. 4).

The processing, communication, and distribution module 212 converts the received voltage into one or more other voltages, such as 8 volts DC, 5 volts DC, 3.3 volts DC, 1.8 volts DC, 1.35 volts DC, and 1.0 volts DC. The processing, communication, and distribution module 212 includes one or more voltage converters (e.g., DC-to-DC converters) configured to convert the received voltage into the one or more other voltages.

A plurality of electrical conductors (e.g., traces) generally illustrated by 224 are connected between pins of the processing, communication, and distribution module 212 (e.g., pins) and pins of the connector 220, respectively. The processing, communication, and distribution module 212 may output the received voltage (Vbatt) to the connector 220 via one of the electrical conductors 224. The processing, communication, and distribution module 212 may output the one or more other voltage to the connector 220 via other ones of the electrical conductors 224, respectively.

The processing, communication, and distribution module 212 may also include one or more communication pins that are connected to respective ones of the electrical conductors 224 to communicate via one or more communication protocols. For example, eight communication pins of the processing, communication, and distribution module 212 and eight of the electrical conductors 224 may be used to communicate via Ethernet, such as 1000 Base-T Ethernet. As another example, four communication pins of the processing, communication, and distribution module 212 and four of the electrical conductors 224 may be used to communicate via a serial peripheral interface (SPI). As another example, two or more communication pins of the processing, communication, and distribution module 212 and two or more of the electrical conductors 224 may be used to communicate via universal asynchronous receiver-transmitter (UART) communication. As another example, two or more communication pins of the processing, communication, and distribution module 212 and two or more of the electrical conductors 224 may be used to communicate via inter-integrated circuit (I2C) communication.

The processing, communication, and distribution module 212 may also include one or more (e.g., four or more) analog input/output pins that are connected to respective ones of the electrical conductors 224. The processing, communication, and distribution module 212 may also include one or more (e.g., four or more) digital input/output pins that are connected to respective ones of the electrical conductors 224. In various implementations, the connector 220 may be a 64 pin connector or another suitable type of connector having another number of pins.

An example pinout of the connector 220 is provided below. While an example pinout of the connector 220 is provided, the present application is also applicable to other pinouts.

| Pin # | Description |
| --- | --- |
| 1 | BI_DA+ |
| 2 | BI_DA− |
| 3 | BI_DB+ |
| 4 | BI_DC+ |
| 5 | BI_DC− |
| 6 | BI_DB− |
| 7 | BI_DD+ |
| 8 | BI_DD− |
| 9 | Vbatt |
| 10 | 8V0 |
| 11 | 5V0 |
| 12 | 3V3 |
| 13 | 1V8 |
| 14 | 1V35 |
| 15 | 1V0 |
| 16 | Gnd |
| 17/25/33 | SPI: SCLK |
| 18/26/34 | SPI: MOSI |
| 19/27/35 | SPI: MISO |
| 20/28/36 | SPI: SS |
| 21/29/37 | UART: TxD |
| 22/30/38 | UART: RxD |
| 23/31/39 | I$^2$C: SCL |
| 24/32/40 | I$^2$C: SDA |
| 41/49/57 | AIO1 |
| 42/50/58 | AIO2 |
| 43/51/59 | AIO3 |
| 44/52/60 | AIO4 |
| 45/53/61 | DIO1 |
| 46/54/62 | DIO2 |
| 47/55/63 | DIO3 |
| 48/56/64 | DIO4 |

Figure 5:
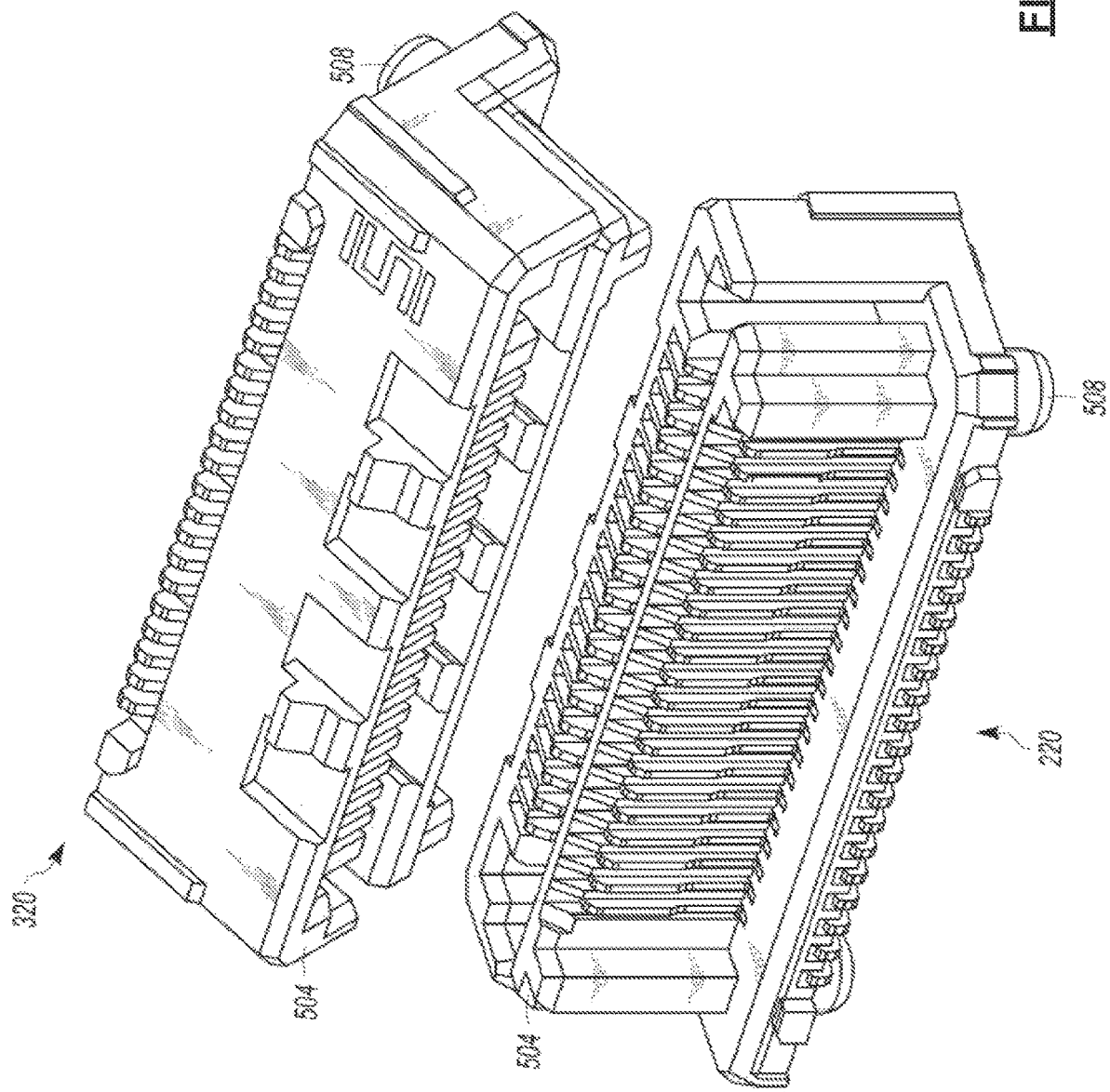
FIG. 5 includes a perspective view of an example implementation of connectors.

In the pinout above, pins 1-8 may be used for Ethernet communication. Pins 9-16 may be used to supply various different voltages including the received voltage (Vbatt) and the other voltages. The remaining pins may be used for SPI, UART, I2C, analog, and digital communication. FIG. 5 includes a perspective view of an example implementation of the connector 220.

The base module 200 may also include two or more apertures through the PCB 204. For example, four apertures 228 are illustrated in the example of FIG. 2. As discussed further below, PCB spacers/standoffs (e.g., hex standoffs) may be secured via the apertures 228 and used to separate modules from each other and secure modules to each other. The connector 220 enables each module to be connected to and utilize each voltage and communication type with the base module 200.

Figure 3A:
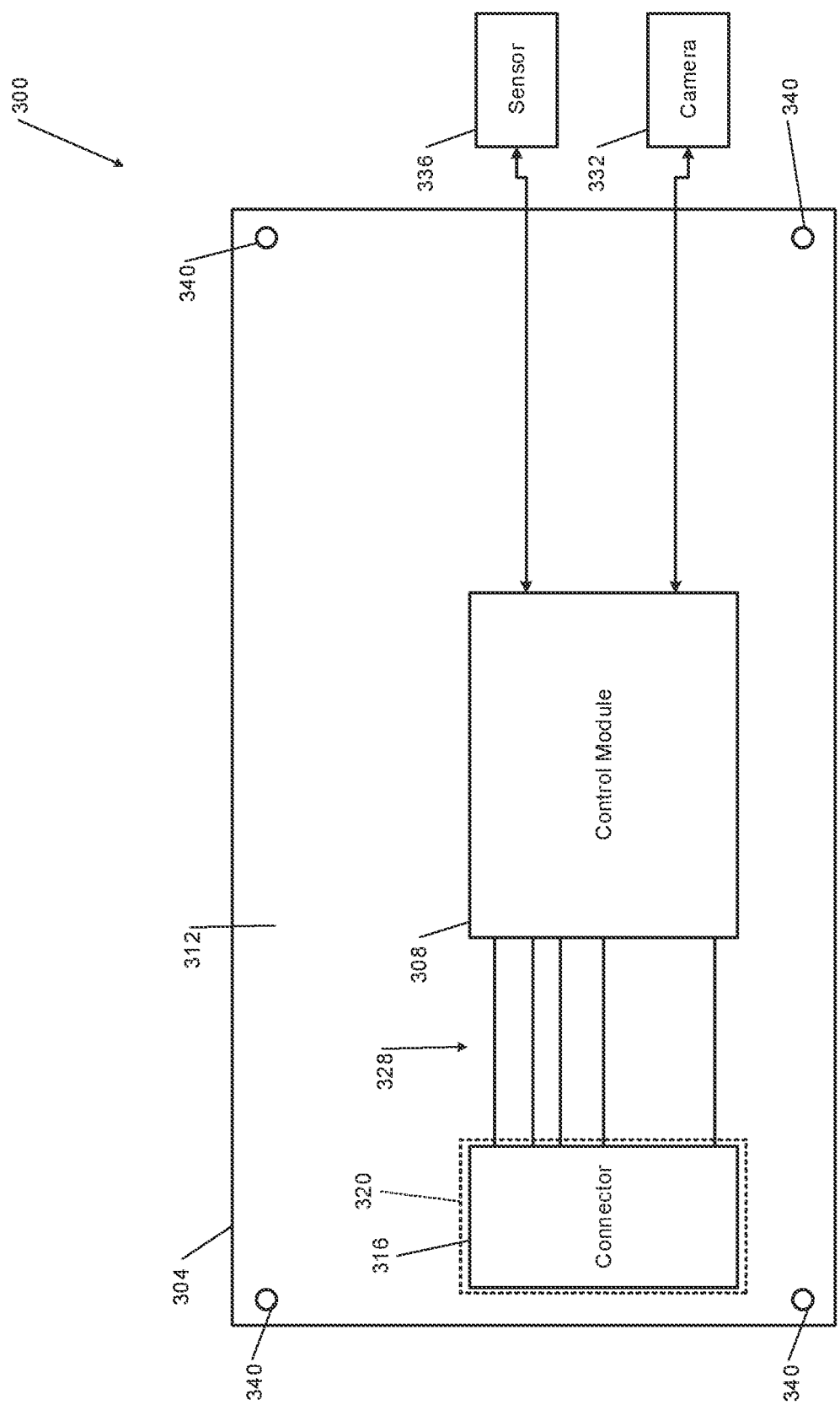

FIG. 3A includes a top view of an example second module 300 for an ADAS, such as within the passenger cabin 104. FIG. 3B includes a bottom view of the example second module 300 of FIG. 3A.

The second module 300 of FIGS. 3A and 3B has the same form factor as the base module 200. The second module 300 includes a circuit board 304, such as a PCB. A control module 308 is implemented on a first surface 312 of the circuit board 304. A connector 316 that is the same connector as the connector 220 is also implemented on the first surface 312. The connector 316 is implemented on a same placement area of the second module 300 as the placement area where the connector 220 is implemented on the base module 200. In this manner, another module (of another ADAS) can be connected to the second module 300 and ultimately to the base module 200.

As shown in FIG. 3B, a second connector 320 may be disposed on a second surface 324 of the circuit board 304. The pins of the second connector 320 are electrically connected to the pins of the connector 316, respectively. For example, the second connector 320 may be a female type connector and the connector 316 and the connector 220 may be a male type connector. Alternatively, the second connector 320 may be a male type connector and the connector 316 and the connector 220 may be a female type connector. The second connector 320 is configured to mate (mechanically connect) with and electrically connect with the connector 220 or 316 of another module. In various implementations, the second connector 320 may be omitted. For example, the connector 220 may include pins that extend into apertures in the connector 320 or the connector 320 may include pins that extend into apertures in the connector 220.

FIG. 5 also includes an example of the connector 320. As shown in FIG. 5, the connectors 220 and 320 may include one or more guide features 504 configured to guide the connectors 220 and 320 together such that pins of the connector 320 directly contact respective pins of the connector 220. The connectors 220 and 320 may also include alignment features 508 configured to polarize the connectors to the respective circuit boards.

Referring back to FIGS. 3A and 3B, each different type of module (for an ADAS) may use one or more different voltages and/or one or more different types of communication. The second module 300 includes electrical conductors generally illustrated by 328 connected between ones of the pins of the connector 316 and pins of the control module 308. Electrical connectors to the other ones of the pins may be omitted. In this manner, the control module 308 receives the one or more used voltages from the base module 200 and can communicate with the base module 200 via the one or more different communication types.

For example, the ICMS 132 may include a camera that is connected to the I2C SCL and SDA pins, one or more IR sensors that are connected to one or more analog I/O pins, and one or more radar sensors connected to one or more SPI pins and/or the Ethernet pins. The DMS 124 may be connected to one or more SPI pins, the battery voltage pin, the 1.8 volt pin, the 3.3 volt pin, and the 1.35 volt pin. The radar module 136 may be connected to one or more SPI pins and/or the Ethernet pins. A forward facing vision module may be connected to one or more UART pins and may satisfy one or more joint test action group (JTAG) standard. A night vision module may be connected to one or more I2C pins, the battery voltage pin, the 1.8 volt pin, the 3.3 volt pin, and the 1.2 volt pin. The restrains module may be connected to the battery voltage pin and may satisfy one or more joint test action group (JTAG) standard.

The control module 308 is connected to one or more sensors and/or cameras utilized by the ADAS of the second module 300, such as camera 332 and sensor 336. Examples of cameras include red, green, blue (RGB) cameras, greyscale cameras, infrared cameras, and other types of cameras. Examples of sensors include radar sensors, light distancing and ranging (LIDAR) sensors, laser sensors, infrared sensors, sonar sensors, and other types of sensors.

The control module 308 may perform one or more functions of the ADAS based on input from the camera(s) and/or sensor(s). For example, the control module 308 may determine one or more characteristics of the driver of the vehicle 100 based on input from the camera(s) and/or sensor(s). The control module 308 may also power the camera(s) and/or sensor(s) using power received via the connector 316 from the base module 200.

The second module 300 may also include two or more apertures 340 through the circuit board 304 in the same placement areas as the apertures 228 of the base module 200. For example, four apertures 340 are illustrated in the example of FIGS. 3A-3B. As discussed further below, PCB spacers/standoffs (e.g., hex) may be secured via the apertures 340 and used to separate modules from each other and secure modules to each other. The connector 220 enables each module to be connected to and utilize each voltage and communication type with the base module 200.

Figure 4:
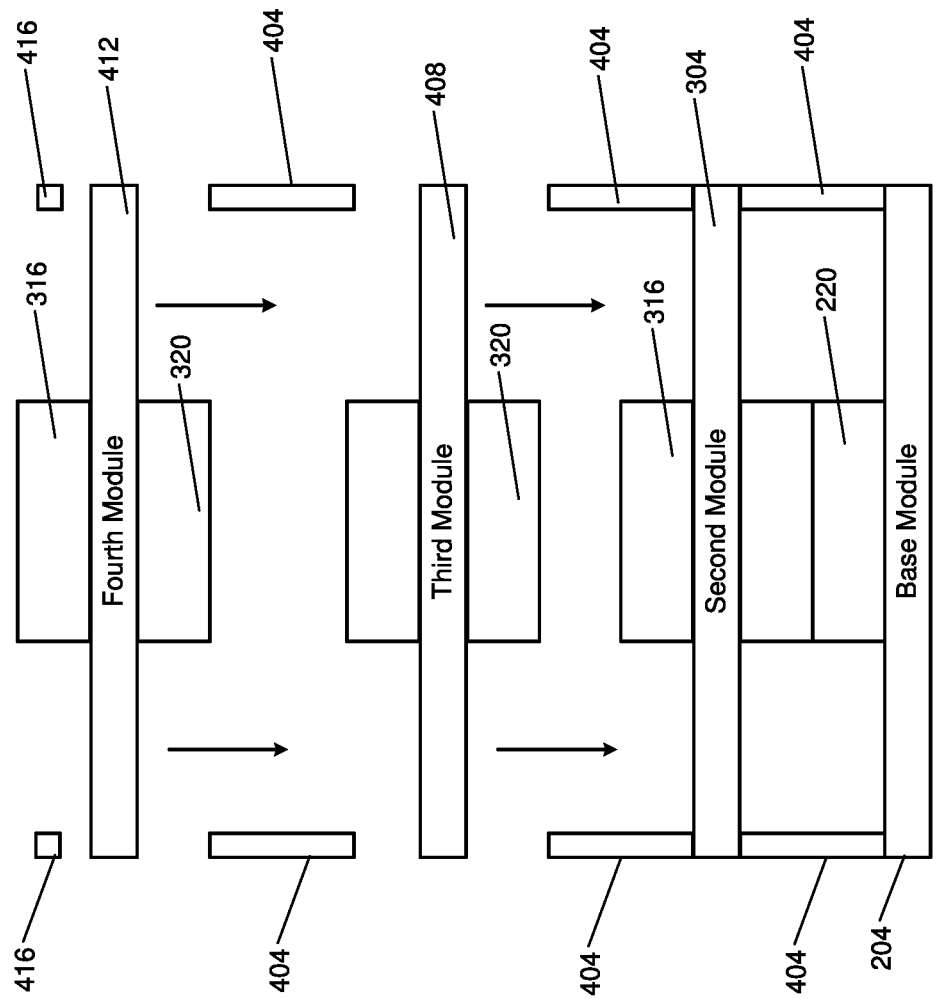
FIG. 4 includes a side perspective view of the base module and multiple other modules.

FIG. 4 includes a side perspective view of the base module 200 and multiple other modules, such as the second module 300, having the same form factor as the base module 200. The common form factor of the modules and the placement of the connectors and apertures in the same placement areas on each circuit board enables connection of one or more modules for one or more ADAS, respectively, to the base module 200.

As shown, the connector 320 may be configured to mate with and electrically connect to the connector 220. Spacers/separators or standoffs (e.g., hex standoffs) 404 may be used to connect and separate modules from each other via the apertures of the respective circuit boards.

A shown in FIG. 4, because each module has a common form factor and one or more connectors located in the same placement area on its circuit board, more than one module (for more than one ADAS) can be connected to and secured to the base module 200. In the example of FIG. 4, a third module for a third ADAS may include a circuit board 408 such as a PCB and be connected to the second module 300 via its connector 320 and the connector 316 of the second module 300. Spacers/separators/standoffs 404 may be used to connect and separate the third module from the second module 300 via the apertures.

A fourth module for a fourth ADAS may include a circuit board 412 such as a PCB and be connected to the third module via its connector 320 and the connector 316 of the third module. Spacers/separators/standoffs 404 may be used to connect and separate the third module from the second module 300 via the apertures. Fasters (e.g., screws) 416 may couple with the connectors 404 through the apertures in the fourth module. While the example of four modules is provided, a greater or lesser number of modules may be implemented.

Referring back to FIG. 2, the processing, communication, and distribution module 212 may perform one or more actions based on the output of one or more control modules of one or more of the modules that are connected (indirectly or directly) to the base module 200 via the connector 220. For example, the processing, communication, and distribution module 212 may perform sensor fusion on the outputs of one or more of the control modules. Sensor fusion may provide a more comprehensive analysis of the environment than the modules individually. Additionally or alternatively, the processing, communication, and distribution module 212 may communicate the outputs of one or more of the modules to the network 144 for use by one or more other modules.

The processing, communication, and distribution module 212 may automatically detect when one or more modules are connected to the connector 220 or the connector of another module. For example, the processing, communication, and distribution module 212 may determine that a module has been connected when the processing, communication, and distribution module 212 detects a voltage decrease and/or a current increase (e.g., on one or more of the conductors 224). Additionally or alternatively, when a module is connected and powered, the module may transmit a message to the processing, communication, and distribution module 212 via one or more of the communication pins. The processing, communication, and distribution module 212 may detect the module in response to receipt of the message.

Figure 6:
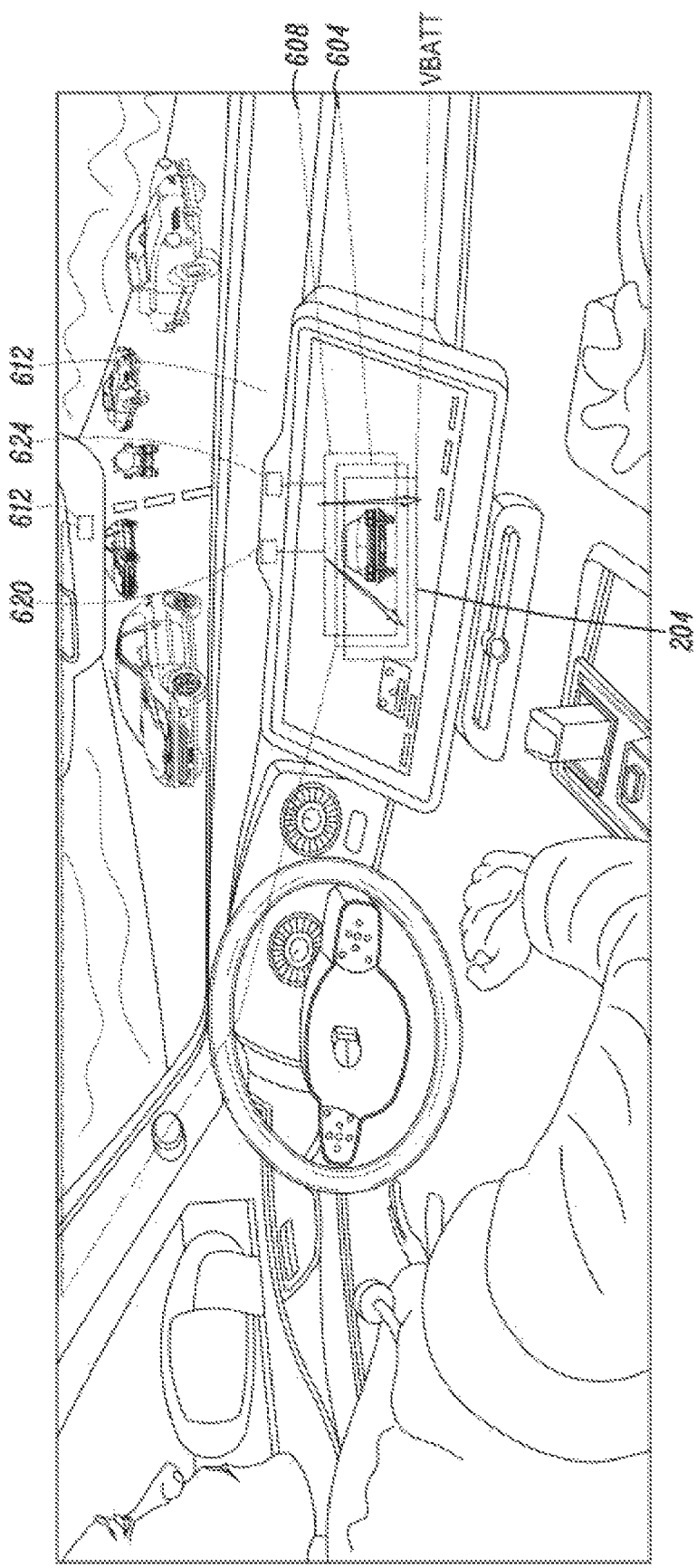
FIG. 6 includes a perspective view from within an example passenger cabin of a vehicle including a base module and multiple other modules.

FIG. 6 includes a perspective view from within an example passenger cabin of a vehicle. In the example of FIG. 6, the base module 204, a second (a vision module) module 604, and a third (DMS module) module 608 are connected as described above and disposed behind an instrument panel 612. The base module 204 may receive power from a battery of the vehicle (VBatt). The second module 604 is connected by wire to one or more cameras that capture images outside of the vehicle, such as forward facing camera 616. The second module 604 receives images captured by the camera(s) and may take one or more actions based on one or more of the images. The second module 604 is also configured to power the camera(s).

The third module 608 is connected by wire to an infrared (IR) transceiver 620 and a driver camera 624. The driver camera 624 capture images within the passenger cabin and including a driver of the vehicle. The third module 608 is configured to monitor characteristics of the driver based on input from the IR transceiver 620 and the driver camera 624. The third module 608 is also configured to power the IR transceiver 620 and the driver camera 624.

While an example location of the base, second, and third modules 204, 604, and 608 is illustrated in FIG. 6, the base, second, and third modules 204, 604, and 608 may be disposed in another location behind the instrument panel 612. Also, while the example of the base, second, and third modules 204, 604, and 608 is provided, one of the second and third modules 604 and 608 may be omitted. Additionally or alternatively, one or more modules may be connected to the base module 204.

Figure 7:
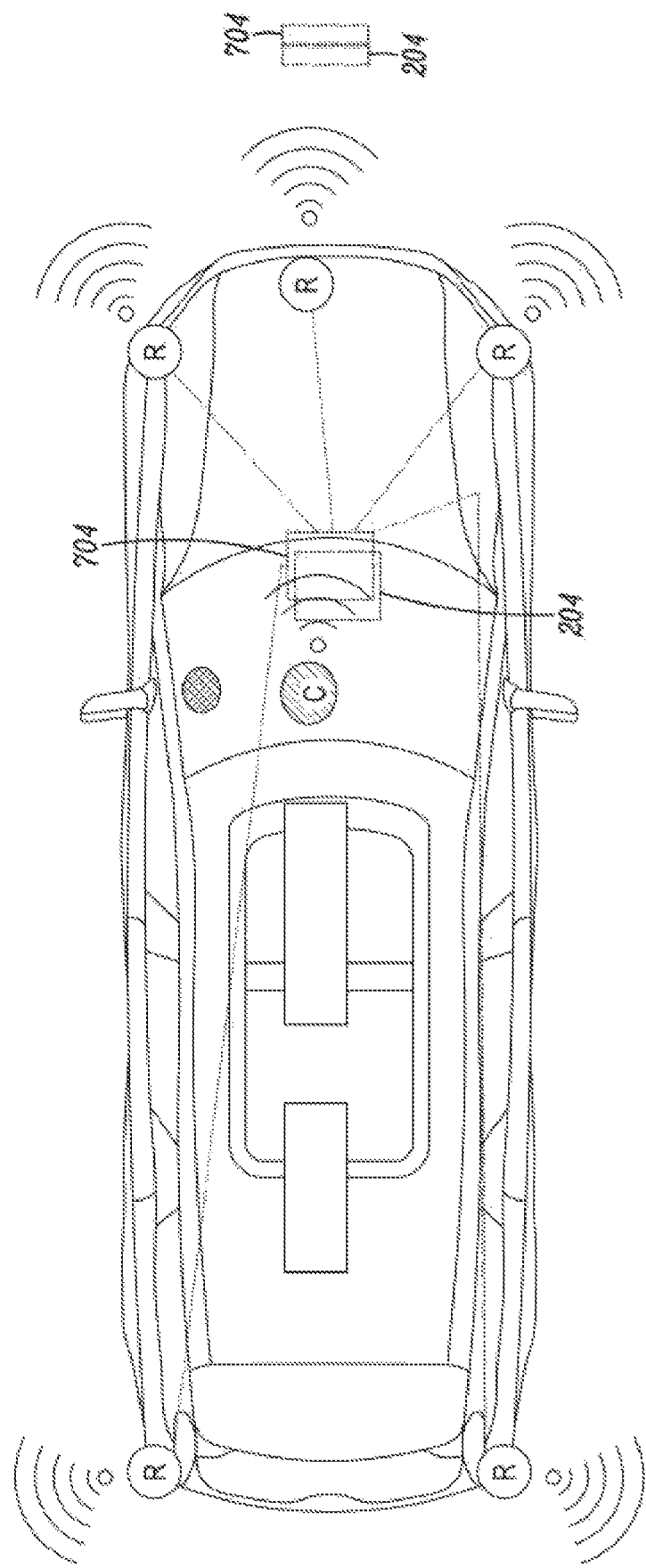
FIGS. 7 and 8 include top views of an example vehicle including a base module and one or more other modules.
Figure 8:
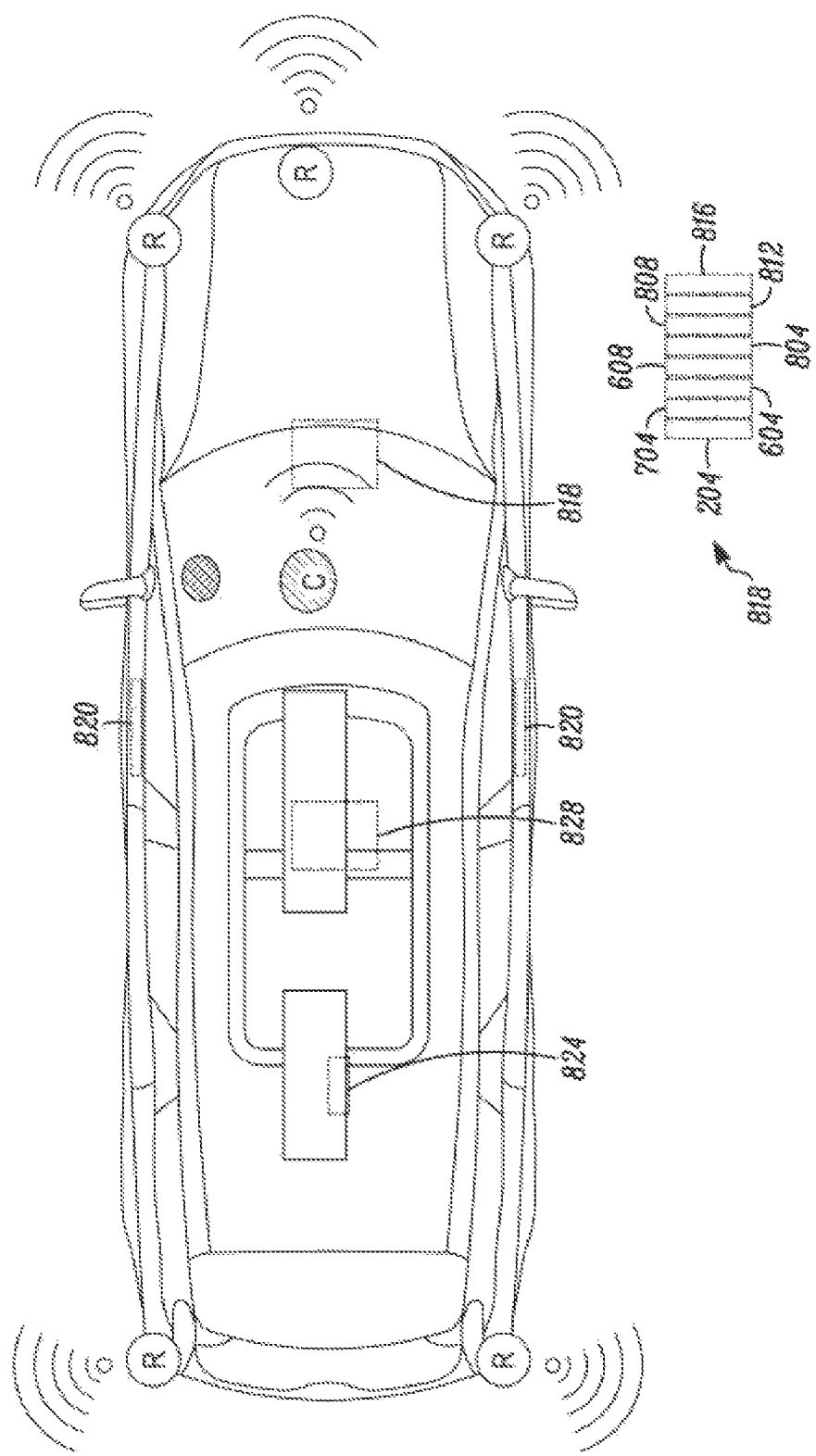

FIGS. 7 and 8 include example top views of an example vehicle. In FIG. 7, the base module 204 and a second (a radar module) module 704 are connected as described above and disposed behind the instrument panel. While the example of the base module 204 and one or more other modules being disposed behind the instrument panel are illustrated in FIGS. 6-8, the base module and one or more other modules may instead be disposed behind one or more other interior trim panels and/or in another suitable location.

The second module 704 is connected by wire to one or more radar transceivers R that transmit and receive radar signals outside of the vehicle. The second module 708 takes one or more actions based on signals received from the radar transceivers. For example, the second module 708 may detect one or more objects located around the vehicle based on signals from the radar transceivers. The second module 708 is also configured to power the radar transceivers. While locations and directions of example radar transceivers are provided, the present application is also applicable to a greater or lesser number of radar transceivers and/or to other locations.

In FIG. 8, the base module 204 and the second (radar) module 704, the second (vision) module 604, the third (DMS) module 608, a fourth (restraint control) module 804, a fifth (global positioning system (GPS)) module 808, a sixth (OTA update) module 812, and a seventh (lidar) module 816 are connected as described above and disposed behind the instrument panel. Wiring is omitted in FIG. 8 for clarity. However, the modules are connected by wire to respective input devices (e.g., sensors, cameras, etc.) and output devices. The base module 204, the second (radar) module 704, the second (vision) module 604, the third (DMS) module 608, the fourth (restraint control) module 804, the fifth (GPS) module 808, the sixth (OTA update) module 812, and the seventh (lidar) module 816 are generally illustrated by 818.

The fourth module 804 is connected by wire to one or more collision sensors and/or acceleration sensors, such as 820 and other sensors. While example sensors 820 are shown, the fourth module 804 may receive signals from one or more other sensors. The fourth module 804 takes one or more actions based on its input signals. For example, the fourth module 804 may deploy one or more airbags based on one or more of the input signals. Additionally or alternatively, the fourth module 804 may actuate one or more seatbelts based on one or more of the input signals. The fourth module 804 may power its respective inputs.

The fifth (GPS) module 808 is connected by wire to a GPS antenna 824. The fifth module 808 may also power the GPS antenna 824. The fifth module 808 may determine a present location of the vehicle based on signals from the GPS antenna 824.

The sixth (OTA update) module 812 may include a transceiver (e.g., a WiFi or cellular transceiver) and one or more antennas. The sixth module 812 may receive code for updating code of the vehicle via the transceiver and update code of the vehicle with code received via the transceiver. The code may be received wirelessly from one or more remote data sources.

The seventh (lidar) module 816 is wirelessly connected to one or more light detection and ranging (LIDAR) sensors, such as LIDAR sensor 828. The LIDAR sensor 828 may be located, for example, on a roof of the vehicle. The LIDAR sensor 828 transmits and receives signals outside of the vehicle. The seventh module 816 takes one or more actions based on signals received from the LIDAR sensor 828. For example, the seventh module 816 may detect one or more objects located around the vehicle based on signals from the LIDAR sensor 828. The seventh module 816 is also configured to power the LIDAR sensor 828.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. An electronic system for a vehicle, comprising:
    a first module including:
        a first circuit board having a predetermined form factor;
        a second module on the first circuit board and including a plurality of pins;
        a first electrical connector disposed on a first surface of the first circuit board and including a plurality of pins; and a first plurality of electrical conductors connecting the pins of the first electrical connector with the pins of the second module, respectively wherein the second module is configured to:
   receive an input voltage;
   convert the input voltage to a plurality of different voltages; and
   output the different voltages via ones of the first plurality of electrical conductors, respectively; and a third module including:
   a second circuit board having the predetermined form factor;
   a fourth module on the second circuit board and including a plurality of pins;
   a second electrical connector disposed on a first surface of the second circuit board and including a plurality of pins, the second electrical connector coupled to the first electrical connector such that the pins of the first electrical connector are electrically connected to the plurality of pins of the second electrical connector, respectively;
   a third electrical connector disposed on a second surface of the second circuit board that is opposite the first surface of the second circuit board, the third electrical connector including a plurality of pins that are electrically connected to the plurality of pins of the second electrical connector, respectively; and
   a second plurality of electrical conductors connecting ones of the pins of the fourth module with one of: (a) ones of the pins of the second electrical connector, respectively; and (b) ones of the pins of the third electrical connector, respectively.

2. The electronic system of claim 1 wherein the fourth module is further connected to at least one of: (a) a sensor configured to sense at least one parameter within a passenger cabin of the vehicle; and (b) a camera configured to capture images within the passenger cabin of the vehicle.

3. The electronic system of claim 2 wherein the fourth module is configured to perform an advanced driver assistance function based on input from the at least one of (a) the sensor and (b) the camera.

4. The electronic system of claim 2 wherein the fourth module is connected to the sensor, and the sensor is one of a radar sensor and an infrared (IR) sensor.

5. The electronic system of claim 1 further comprising a fifth module including:
   a third circuit board having the predetermined form factor;
   a sixth module on the third circuit board and including a plurality of pins;
   a fourth electrical connector disposed on a first surface of the third circuit board and including a plurality of pins, the third electrical connector coupled to the third electrical connector such that the pins of the third electrical connector are electrically connected to the plurality of pins of the fourth electrical connector, respectively;
   a fifth electrical connector disposed on a second surface of the third circuit board that is opposite the first surface of the third circuit board, the fifth electrical connector including a plurality of pins that are electrically connected to the plurality of pins of the fourth electrical connector, respectively; and
   a third plurality of electrical conductors connecting second ones of the pins of the sixth module with second one of: (a) second ones of the pins of the fourth electrical connector, respectively; and (b) second ones of the pins of the fifth electrical connector, respectively.

6. The electronic system of claim 5 wherein the sixth module is further connected to at least one of: (a) a sensor configured to sense at least one parameter within a passenger cabin of the vehicle; and (b) a camera configured to capture images within the passenger cabin of the vehicle.

7. The electronic system of claim 1 wherein:
   the first module includes apertures through the first circuit board at predetermined placement areas; and
   the third module includes apertures through the second circuit board at the predetermined placement areas.

8. The electronic system of claim 7 further comprising standoffs disposed at the apertures of the first module and the apertures of the third module and configured to separate the first and third modules.

9. The electronic system of claim 1 wherein the first surface of the first circuit board faces the first surface of the second circuit board.

10. The electronic system of claim 1 wherein:
   the first electrical connector is disposed in a placement area on the first surface of the first circuit board; and
   the third electrical connector is disposed on the placement area on the second surface of the second circuit board.

11. The electronic system of claim 1 wherein the first and third modules are disposed behind trim of a passenger cabin of the vehicle.

12. The electronic system of claim 1 wherein the first and second circuit boards are printed circuit boards.

13. The electronic system of claim 1 wherein the different voltages are less than the input voltage.

14. The electronic system of claim 1 wherein the input voltage is a voltage of a battery of the vehicle.

15. The electronic system of claim 1 wherein the second module is configured to communicate via an Ethernet communication protocol via ones of the first plurality of electrical conductors.

16. The electronic system of claim 1 wherein the second module is configured to communicate using universal asynchronous receiver-transmitter (UART) communication via ones of the first plurality of electrical conductors.

17. The electronic system of claim 1 wherein the second module is configured to communicate using serial peripheral interface (SPI) communication via ones of the first plurality of electrical conductors.

18. The electronic system of claim 1 wherein the second module is configured to communicate using inter-integrated circuit (I2C) communication via ones of the first plurality of electrical conductors.

19. The electronic system of claim 1 wherein:
   at least one of the pins of the first module is configured for analog input and output; and
   at least one of the pins of the first module is configured for digital input and output.

* * * * *